(12) United States Patent
Marsh et al.

(10) Patent No.: US 7,466,156 B2
(45) Date of Patent: Dec. 16, 2008

(54) SYSTEM OF DIGITALLY TESTING AN ANALOG DRIVER CIRCUIT

(75) Inventors: Joseph O. Marsh, Poughkeepsie, NY (US); Jeremy Stephens, Seattle, WA (US); Charlie C. Hwang, Wappingers Falls, NY (US); James S. Mason, Eastleigh (GB); Huihao Xu, Brooklyn, NY (US); Matthew B. Baecher, Newburgh, NY (US); Thomas J. Bardsley, Poughkeepsie, NY (US); Mark R. Taylor, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 941 days.

(21) Appl. No.: 10/708,788

(22) Filed: Mar. 25, 2004

(65) Prior Publication Data
US 2005/0246125 A1  Nov. 3, 2005

(51) Int. Cl.
*G01R 31/02* (2006.01)
(52) U.S. Cl. .................................................... 324/763
(58) Field of Classification Search .................. 324/763
See application file for complete search history.

(56) References Cited
U.S. PATENT DOCUMENTS

| | | | |
|---|---|---|---|
| 4,298,980 A | 11/1981 | Hajdu et al. | |
| 5,107,208 A | 4/1992 | Lee | |
| 5,481,471 A | 1/1996 | Naglestad et al. | |
| 5,610,530 A | 3/1997 | Whetsel | |
| 5,657,456 A * | 8/1997 | Gist et al. | 710/100 |
| 5,861,774 A | 1/1999 | Blumenthal | |
| 6,011,387 A | 1/2000 | Lee | |
| 6,185,710 B1 * | 2/2001 | Barnhart | 714/727 |
| 6,535,945 B1 * | 3/2003 | Tobin et al. | 710/305 |
| 6,609,221 B1 * | 8/2003 | Coyle et al. | 714/715 |
| 6,680,681 B1 | 1/2004 | Hsu et al. | |

OTHER PUBLICATIONS

"Digital Systems Testing and Testable Design", IEEE Press, Ch. 9.3-9.9, 1990.
"BIST for D/A and A/D Converters", IEEE Design & Test of Computers v. 13 n. 4 Winter 1996, pp. 40-49.
U.S. Appl. No. 10/604,025, "Data Transceiver and Method for Equalizing the Data Eye of a Differential Input Data Signal", Camara, et al.

* cited by examiner

*Primary Examiner*—Ha Nguyen
*Assistant Examiner*—Roberto Velez
(74) *Attorney, Agent, or Firm*—Steven Capella (57) ABSTRACT

A circuit of testing an analog driver circuit using digital scan-based test methodologies. The circuit of the present invention includes a control circuit for generating signals in response to a test enable signal, a differential driver circuit for receiving a differential input signal, amplifying the differential input signal and transmitting a differential output signal in response to the differential input signal and the signals generated by the control circuit, a programmable termination impedance circuit for generating a differential termination impedance at the output node of the differential driver circuit in response the signals generated by the control circuit, and a differential receiver circuit for receiving the differential output from the differential driver circuit, convert the differential output signal to a single ended signal and transmitting the single ended signal, all in response to the test enable signal.

13 Claims, 6 Drawing Sheets

FIG. 6

SYSTEM OF DIGITALLY TESTING AN ANALOG DRIVER CIRCUIT

BACKGROUND OF INVENTION

The present invention relates to testing analog driver circuitry using digital scan-based test methodologies such as level-sensitive scan design (LSSD) or any flip-flop based scan technique. Digital scan-based test methodologies typically define a number of Shift Register Latches ("SRLs") that are electrically coupled in series and may be set deterministically by digital test equipment, such that application of a test vector defines the state of the device under test. Separate SRLs may be driven by outputs of the device under test. After the test is complete, the test equipment scans the output vector out of the SRLs and compares it against an expected output vector. SRLs which sense the output of a circuit under test can only interpret digital states and cannot interpret an analog state. Digital scan-based testing methodologies are well known in the art, and in particular, the implementation of a digital scan architecture into a design, the generation of patterns for testing the design, and the stimulation and observation of circuits within the design is well known. For example, see U.S. Pat. No. 4,298,980, entitled LSI Circuitry conforming to level sensitive scan design (LSSD) rules and method of testing same, by Hajdu et al. Use of SRLs for scan-based testing is well known to those skilled in the art. For example, see Miron Abramovici et al., "Digital Systems Testing and Testable Design", IEEE PRESS, Ch. 9.3-9.9, 1990.

Analog driver circuitry typically requires functional testing to ascertain whether the driver functions as expected. As technology integration has become more complex, for example the integration of analog and digital circuits in the same design, testing of analog circuitry has become more difficult and expensive. There are several disadvantages associated with functional testing, such as: (1) it is more difficult to debug a functional test of a large analog/digital circuit as compared to digital scan-based logical paths; (2) it is more expensive to package a device for functional test than to test the device at the wafer level; and (3) more generally, development cost, difficult debugging and the high cost of test hardware make functional testing unappealing. For example, as operating voltages continue to decrease (e.g. 1.2V and below) and as the precision of digital-to-analog converters (DACs) increase, it is extremely difficult to digitally test the least significant bits (LSBs) of DACs where the DAC current output is converted to a voltage with a very low impedance (e.g. 50 ohms). For illustrative purposes, consider a seven-bit DAC which is operated at 1.2V. The output differential amplitude of the DAC for the LSB would be 9 mV at an output termination impedance of 50 ohms (1.2V/127). The offset voltage of a differential receiver is typically much larger than the LSB of the DAC, thus making the receiver's interpretation of the driver output unreliable. It is therefore desirable to provide a system and apparatus which is capable of testing an analog driver circuit of a mixed-signal design at the wafer-level, avoiding the extra cost associated with analog test equipment or on-chip analog BIST circuits.

See the following US patents for examples of analog test equipment, which are typically expensive and add to circuit test time: U.S. Pat. No. 5,610,530, entitled Analog interconnect testing, by Whetsel; U.S. Pat. No. 5,481,471, entitled Mixed signal integrated circuit architecture and test methodology, by Naglestad et al.; U.S. Pat. No. 5,107,208, entitled System for partitioning and testing submodule circuits of an integrated circuit, by Lee; and U.S. Pat. No. 6,011,387, entitled Analog autonomous test bus framework for testing integrated circuits on a printed circuit board, by Lee. See the following references for examples of analog BIST circuits implemented on chip, which are expensive in design time and chip area: U.S. Pat. No. 5,861,774, entitled Apparatus and method for automated testing of a programmable analog gain stage, by Blumenthal; and Karim Arabi, Bozena Kaminska, and Janusz Rzeszut, "BIST for D/A and A/D converters," IEEE Design & Test of Computers v. 13 n. 4 Winter 1996, pp. 40-49.

BRIEF DESCRIPTION OF SEQUENCES

The present inventors believe that the prior art has at least the following drawbacks:

Accordingly, an object of the invention is to digitally test an analog driver circuit.

Another object of the invention is to digitally test an analog driver circuit using a scan-based testing methodology.

Another object of the invention is to digitally stimulate and observe an analog driver circuit from shift-register latches.

Another object of the invention is to digitally stimulate and observe the least-significant-bit of an analog driver circuit by skewing the output termination impedance of an analog driver circuit.

Another object of the invention is to digitally test an analog driver circuit by converting the differential output of an analog driver circuit into a common mode signal by skewing the output termination impedance of the analog driver circuit, detecting the skewed signal with a differential receiver circuit and converting the detected skewed signal into a single-ended signal for observation.

Another object of the invention is to digitally test an analog driver circuit by detecting a skewed signal with a differential receiver circuit, wherein the receiver circuit incorporates a comparator circuit with built-in offset voltage for reliably detecting the state of the driver circuit.

Another object of the invention is to either skew or match the output termination impedance of a differential driver circuit in response to a test enable signal, wherein the impedance is skewed when the test enable signal is active and matched otherwise.

Another object of the invention is to receive a skewed common mode signal with a differential receiver circuit and convert the detected signal into a single-ended signal in response to a test enable signal.

Another object of the invention is to disable an up-channel receiver, enable the up-channel receiver for up-channel signaling, or enable the up-channel receiver for digital scan-based testing, all in response to a test enable signal.

DETAILED DESCRIPTION

Figure 1:
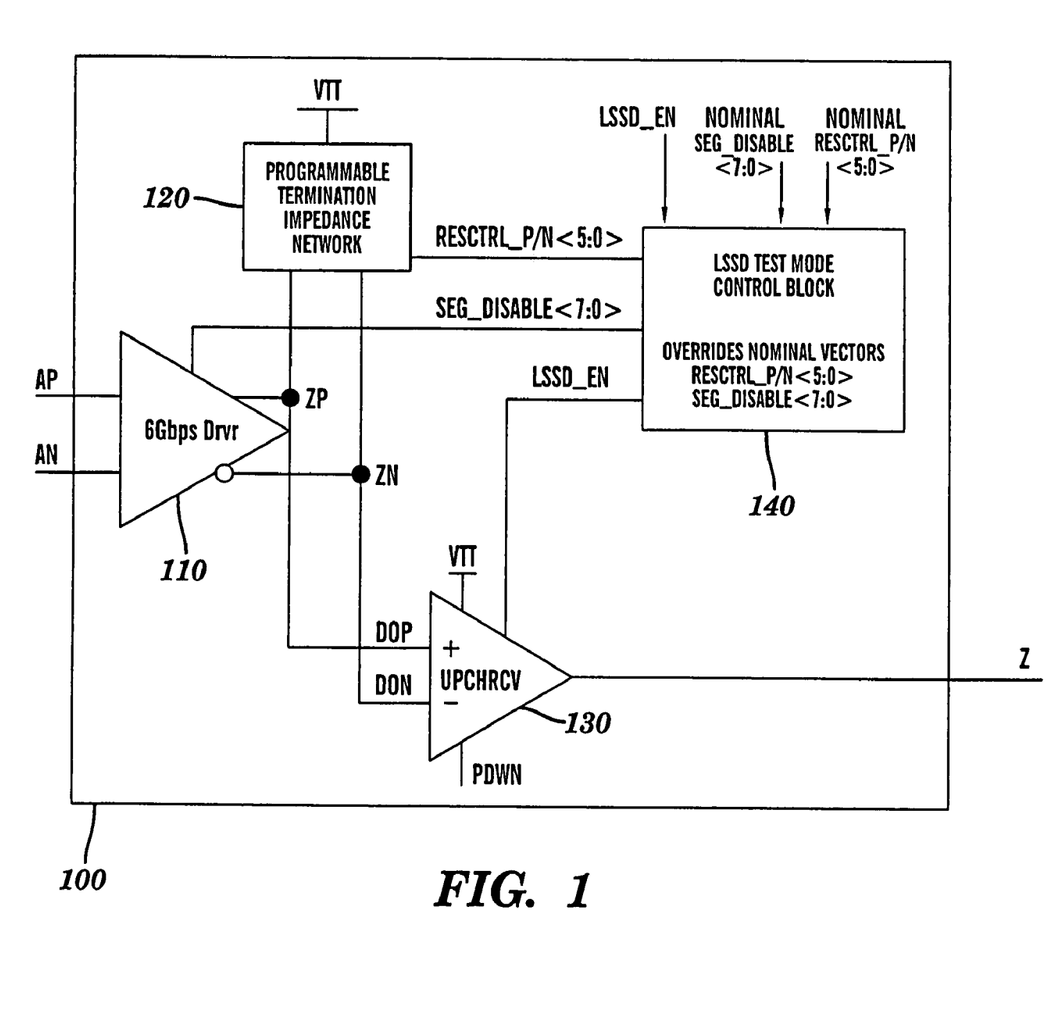
FIG. 1 is a diagram illustrating a scan-compatible analog differential driver circuit according to the present invention.

FIG. 1 illustrates the preferred embodiment of the invention. Scan-compatible analog differential driver circuit 100 comprises differential driver 110, programmable termination impedance network 120, up-channel receiver 130 and LSSD test mode control circuit 140. Differential driver 110 may be any differential driver circuit incorporating a Digital-to-Analog Converter (DAC) and having large dynamic gain. In the preferred embodiment, driver 110 is a high-speed (e.g. 6 Gbps or higher) differential finite-impulse-response (FIR) I/O driver with large dynamic gain as described in U.S. Pat. No. 6,680,681, entitled High Speed FIR Transmitter, by Hsu et al., the subject matter of which is hereby incorporated by reference in its entirety. Data inputs AP and AN to differential driver 110 represent differential data inputs.

Programmable termination impedance network 120 sets the termination impedance at differential output nodes ZP and ZN. During digital scan test mode (e.g. LSSD testing), programmable termination impedance network 120 skews the termination impedance at differential output nodes ZP and ZN in response to signals RESCTRL_P<5:0> and RESCTRL_N<5:0>. When the termination impedance is skewed at differential output nodes ZP and ZN, the differential output of driver 110 (DOP and DON) is skewed, and thus, up-channel receiver 130 is capable of detecting the full dynamic range of driver 110. Skewing the output termination impedance serves to covert DOP and DON into a common-mode signal. During normal operation, programmable termination impedance network 120 programs the termination impedance at output nodes ZP and ZN in response to signals RESCTRL_P<5:0> and RESCTRL_N<5:0> to the appropriate termination resistance for optimum transmission (e.g. matched 50 Ohm impedance at ZP and ZN).

Up-channel receiver 130 may be any receiver circuit with voltage offset such that when inputs to the receiver are equal, the receiver reliably outputs a low voltage. Alternatively, up-channel receiver 130 may incorporate hysteresis for improved noise immunity during up-channel signaling. Up-channel signaling is well known in the art. For example, see U.S. patent application Ser. No. 10/604025, entitled Data Transceiver And method for Equalizing The Data Eye of a Differential Input Data Signal, assigned to IBM Corporation. In the preferred embodiment, up-channel receiver 130 is a differential receiver with a built-in offset voltage and hysteresis, and is capable of receiving signals transmitted up-channel (i.e. in the opposite direction as the data being transmitted). Such receivers are incorporated in high speed serializer-deserializer (SERDES) circuit designs for up-channel signaling, and thus, circuit area may be minimized when an up-channel receiver with hysteresis is already present in a design. Up-channel receiver 130 is used to complete the observation path from the output of driver 110 to a SRL or a Primary output during digital scan-based testing. During normal operation, up-channel receiver 130 may sense a signal as low as 70 mv. However, there will be some ambiguity at these low levels. Since digital scan-based test mode requires deterministic results of either a logic '1' or '0' without 'x' propagation, the area of ambiguity must be removed. This is accomplished by changing the characteristics of up-channel receiver 130 during test mode. When up-channel receiver 130 is placed in test mode by LSSD_EN, offset and gain characteristics of the receiver are changed such that the receiver now requires a 150 mv signal or the output will result in a '0'. This increased voltage offset (~70 mv) guarantees that when all DACs are turned off in driver 110, there will be a logic '0' output from up-channel receiver 130 at node Z. Additionally, by skewing the termination impedance at nodes ZP and ZN during test mode, the LSB of driver 110 can be observed as a logic '1' at the output of up-channel receiver 130.

LSSD Test Mode Control Block 140 enables scan-compatible driver circuit 100 of FIG. 1 for digital testing by overriding the nominal control signals RESCTRL_P<5:0> and RESCTRL_N<5:0> and by overriding the nominal segment control vector SEG_DISABLE<7:0>. By overriding the nominal control signals RESCTRL_P<5:0> and RESCTRL_N<5:0>, the output termination impedance at nodes ZP and ZN may be skewed, thus allowing observation of the LSB of the differential driver. By overriding the nominal segment control vector SEG_DISABLE<7:0>, each segment of differential driver 110 may be tested one at a time, thus assuring the LSBs of the driver are effectively tested for faults. These signals are overridden in response to LSSD_EN. In the preferred embodiment, LSSD_EN signal is a primary input. A detailed description of the aforementioned signals follows.

During digital test mode, up-channel receiver 130 is enabled for digital testing by LSSD_EN and powered on by PDWN. Up-channel receiver 130 functions as an Analog-to-Digital Converter (ADC) and is capable of passing a digital value Z, which represents the output of differential driver 110, to a shift register latch ("SRL") which is observable during digital testing. During digital test mode, the termination impedance is skewed, thus enabling up-channel receiver 130 to detect the full dynamic range of differential driver 110 even though the least-significant-bits (LSBs) effect a much smaller change than up-channel receiver 130 could detect during normal operation. Detecting the LSB of differential driver 110 enables the digital-to-analog converters (DACs) residing within differential driver 110 to be fully digitally modeled (e.g. as a number of n-bit OR gates), thus enabling an automatic test pattern generator to generate test patterns for the entire DAC circuit. If the termination impedance is not skewed, the voltage offset of up-channel receiver 130 will be much larger than the LSB of driver 110, making the receiver's interpretation of the output of driver 110 unreliable. By skewing the termination impedance, the LSB of the DAC may be tested using a scan-based digital test methodology. During normal operation, up-channel receiver 130 is taken out of digital test mode by disabling LSSD_EN. Additionally, up-channel receiver 130 may be powered down by activating PDWN or may remain powered on by leaving PDWN deactivated.

Figure 2:
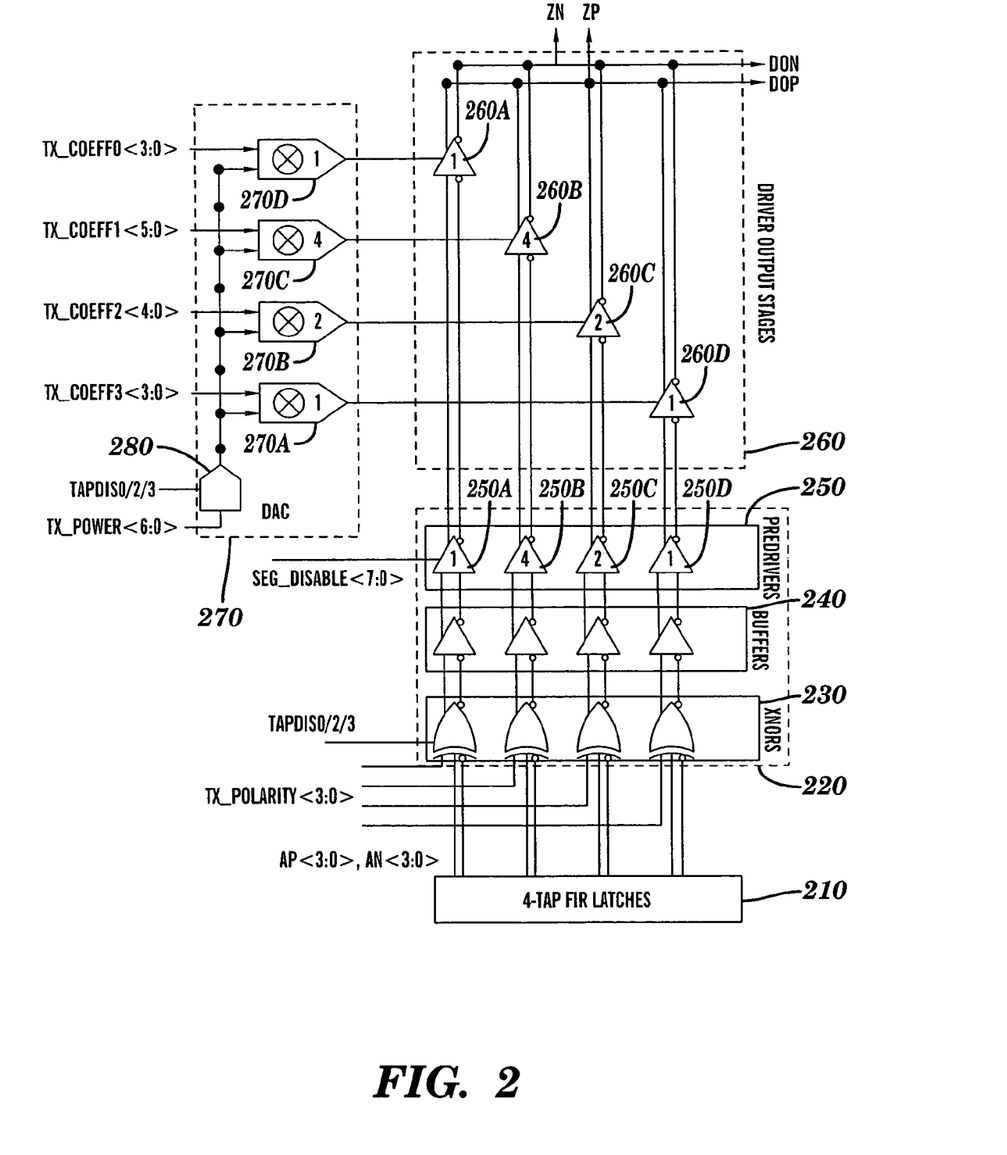
FIG. 2 is a diagram illustrating a differential driver circuit according to the present invention.

FIG. 2 illustrates in further detail differential driver 110 of FIG. 1. Finite Impulse Response (FIR) latches 210 store differential data inputs AP<3:0> and AN<3:0> and present AP<3:0> and AN<3:0> to driver logic 220. XNOR circuits 230 may invert AP<x:0> and AN<x:0> in response to data polarity signal TX_POLARITY<3:0> or may disable AP<x:0> and AN<x:0> in response to data disable signal TAPDIS0/2/3. Buffer circuits 240 buffer the output of XNOR circuits 230. Predriver circuits 250 amplify the differential data signals. Each predriver circuit contains one or more preamplifiers ("segments"). As illustrated in FIG. 2, predriver circuit 250A comprises one segment, predriver circuit 250B comprises four segments, predriver circuit 250C comprises two segments, and predriver circuit 250D comprises one segment. If a differential data bit is preamplified by more than one segment, driver output stages 260 are paralled per segment for that differential data bit. As illustrated in FIG. 2, predriver circuit 250B contains four segments, and therefore, driver 260B will have four parallel differential inputs from each of the four segments contained in predriver circuit 250B.

Each paralleled output stage has a separate predriver, driven from the same driver logic (XNOR circuits 220 and buffer circuits 240). The number of segments per differential data bit determines the drive strength for that differential data bit. The more segments, the higher the drive strength for the programmed current. Any segment may be disabled via the SEG_DISABLE<x:0> signal. The output drive strength of output drivers 260A-260D is set by current DAC (IDAC) circuit 270. IDAC circuit 270 comprises IDACs 270A-270D. The value of each IDAC 270A-270D is set by TX_COEFFX<x:0>. As illustrated in FIG. 2, the value of IDAC 270A is determined by TX_COEFF3<3:0>. The range of the current reference (IREF) for each IDAC 270A-270D is set by the output of power DAC 280, which is controlled by TX_POWER<6:0>. The differential output of drivers 260A-260D are tied together at differential output nodes ZP and ZN to form the final pair of output signals, DOP and DON. During digital testing, signals TX_COEFFX<n:0>, TAP-DIS0/2/3, TX_POWER<6:0>, TX_POLARITY<3:0>, AP<3:0>, and AN<3:0> are supplied from SRLs, thus making the differential driver digitally testable.

Figure 3:
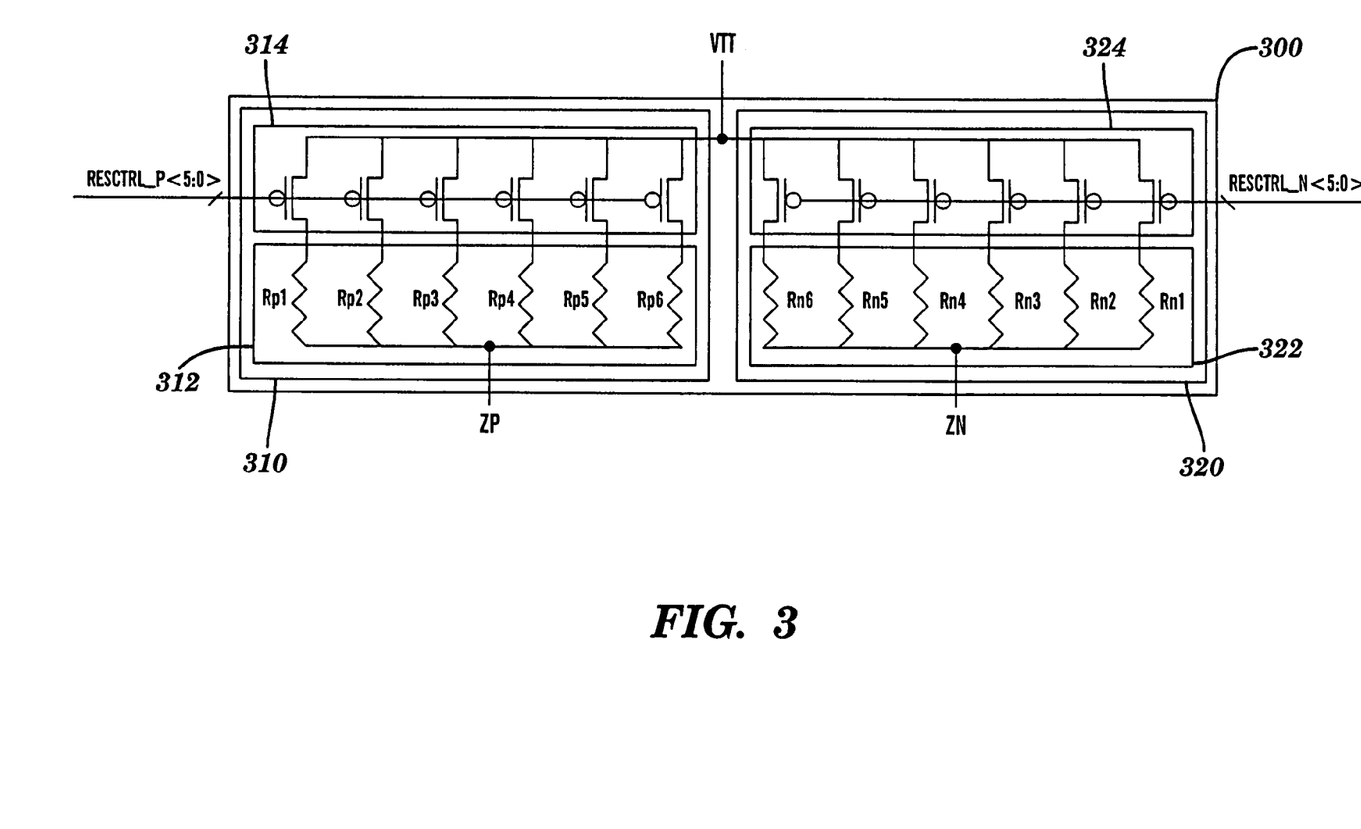
FIG. 3 is a diagram illustrating a programmable termination impedance network according to the present invention.

FIG. 3 illustrates in further detail programmable termination impedance network 120 of FIG. 1. Programmable termination impedance network 300, which corresponds to programmable termination impedance network 120 of FIG. 1, comprises programmable resistor circuits 310 and 320. Resistor circuit 310 comprises a number of resistor components 312 and number of transistor switches 314, wherein one transistor of transistor switches 314 is electrically coupled in series with one resistor of resistor components 312. Resistor circuit 320 also comprises a number of resistor components 322 and number of transistor switches 324, wherein one transistor of transistor switches 324 is electrically coupled in series with one resistor from resistor components 322. When a particular resistor is switched into the resistor network by a transistor, that resistor component is electrically coupled in parallel with all other resistors that are also switched into the network. When a particular resistor is switched out of the resistor network, it is electrically isolated from the impedance network. In the preferred embodiment, resistor circuits 310 and 320 each comprise six resistors, the value of which are as follows: Rp1=53.65 Ohms, Rp2=71.15 Ohms, Rp3=144.35 Ohms, Rp4=286.95 Ohms, Rp5=554 Ohms, and Rp6=3001 Ohms, where: Rn1=Rp1, Rn2=Rp2, Rn3=Rp3, Rn4=Rp4, Rn5=Rp5, and Rn6=Rp6. In the preferred embodiment, transistor switches 314 and 324 comprise six p-FET transistors.

Resistor circuit 310 provides termination impedance to output node ZP of differential driver 110 of FIG. 1 and resistor circuit 320 provides termination impedance to output node ZN of differential driver 110 of FIG. 1. Control signal RESCTRL_P<5:0> programs resistor circuit 310 and control signal RESCTRL_N<5:0> programs resistor circuit 320 by either activating or deactivating the transistor electrically in series with a certain resistor. Both RESCTRL_P and RESCTRL_N are determined by LSSD test mode control block 140 of FIG. 1. RESCTRL_P and RESCTRL_N switch in or out resistor components within resistor circuits 310 and 320, thus programming the termination impedance at nodes ZP and ZN, respectively. During digital scan test mode, the termination impedance provided by resistor circuits 310 and 320 is programmed so that the termination impedance of programmable termination impedance network 300 is skewed at nodes ZP and ZN. For example, the termination impedance at node ZP, determined by those resistors in resistor circuit 310 which are switched in to the network by corresponding transistor switches 314 and those that are not, may be programmed to 54 Ohms while the termination impedance at node ZN is programmed to 554 Ohms. This occurs when RESCTRL_P<5:0>="011111" and RESCTRL_N<5:0>="111101". When the termination impedance is skewed in such a manner, the differential output of driver 110 in FIG. 1 is converted to a common mode signal because the differential signal at node ZN of the driver will be 10× larger than the same signal at node ZP, thus resulting in a differential-to-common mode gain of 5×.

During normal operation, signals RESCTRL_P<5:0> and RESCTRL_N<5:0> program transistor switches 314 and 324 so that the output termination impedance at nodes ZP and ZN match. This occurs when RESCTRL_P<5:0>=RESCTRL_N<5:0>. For illustrative purposes, consider a differential driver that comprises a seven-bit DAC where: the LSB of the 7 bit DAC=1.2V/127=9 mV in terms of driver output differential amplitude at 50 ohms and 90 mV at 500 ohms. LSB of 4/5/6 bit DAC=19 mV of Driver output differential amplitude at 50 ohms and 190 mV at 500 ohms. Up-channel receiver 130 of FIG. 1 is capable of detecting these amplitudes for a termination resistance of 500 ohms, but can not detect these amplitudes at 50 ohms, because the amplitude is less than the receiver's offset voltage. As DACs are designed more precisely, the LSB will become smaller and more difficult to detect in a digital test framework. A number of resistor/transistor combinations as well as resistor values are possible and within the scope of the invention.

Figure 4:
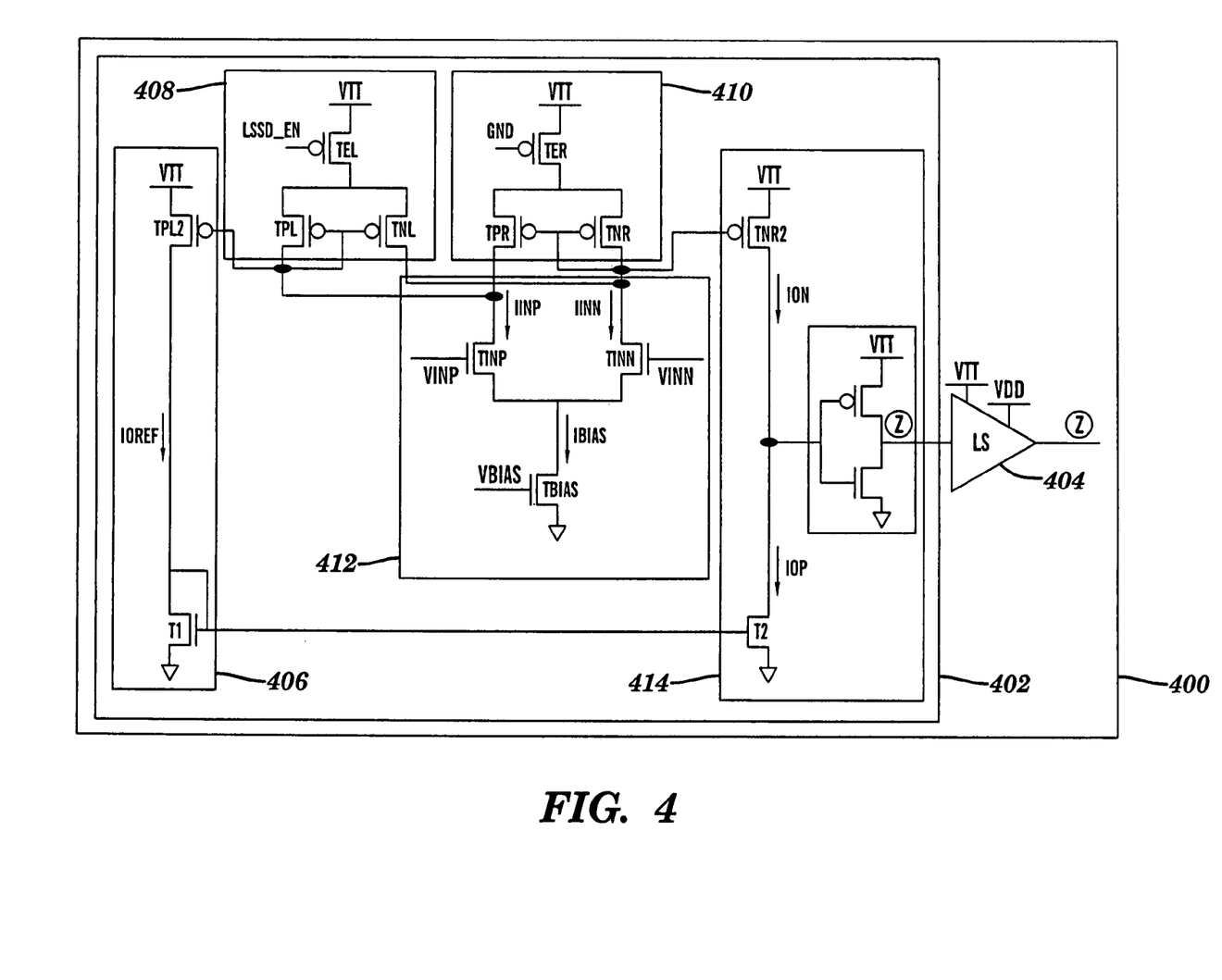
FIG. 4 is a diagram illustrating a differential receiver circuit with built-in offset voltage according to the present invention.

FIG. 4 illustrates in further detail up-channel receiver 400, which corresponds to up-channel receiver 130 of FIG. 1. Up-channel receiver 400 comprises a hysteresis comparator circuit 402 and a common level shifter 404. Common level shifter 404 provides transition from an analog power supply domain ("VTT") to a digital power supply domain ("VDD"). Level shifters are well known to those skilled in the art, and therefore, no further description is necessary. Hysteresis comparator circuit 402 comprises reference current source 406, first built-in offset voltage comparator 408, second built-in offset voltage comparator 410, differential amplifier circuit 412, and output stage 414. Reference current source 406 comprises p-fet transistor TPL2 and n-fet transistor T1 and generates reference current IOREF. Current sources are well known to those skilled in the art, and therefore, no further description is necessary.

First built-in offset voltage comparator 408 comprises p-fet transistors TEL, TPL, and TNL. The comparator has a built-in offset voltage ("Vth−"). The value of Vth− is dependent upon the ratio of TNL to TPL as well as the biasing current IBIAS. In general, the higher the ratio or higher the biasing current, the higher Vth− becomes. As previously stated, this offset voltage provides improved noise immunity. Without this offset voltage, a comparator would output a high when VINP>VINN, output a low when VINP<VINN, and output an unknown value when VINP=VINN. Such a comparator has zero noise margin due to the fact that a minimal amount of noise triggers a response. First built-in offset voltage comparator 408 addresses Low to High transitions at VINP and VINN. VINP corresponds to DOP and VINN corresponds to DON as illustrated in FIG. 1, where DOP and DON represent the differential output of differential driver 110 of FIG. 1.

Second built-in offset voltage comparator 410 comprises p-fet transistors TER, TPR, and TNR. The comparator has a built-in offset voltage ("Vth+"). The value of Vth+ is dependent upon the ratio of TNR to TPR as well as the biasing current IBIAS. In general, the higher the ratio or higher the biasing current, the higher Vth+ becomes. As previously stated, this offset voltage provides improved noise immunity. Second built-in offset voltage comparator 410 addresses High to Low transitions at the inputs VINP and VINN. Differential amplifier circuit 412 comprises n-fet transistors TINP, TINN and TBIAS. Output stage 414 comprises p-fet transistor TNR2, n-fet transistor T2, and inverter circuit 416. Transistors TNR2 and T2 supply an input signal to inverter circuit 416 and the inverter inverts that signal. Differential amplifiers, output stages and inverters are all well known to those skilled in the art, and therefore, no further description is necessary. Common level shifter 404 transitions the output of inverter circuit 416 from VTT to VDD and outputs a signal Z.

Up-channel receiver 400 is either disabled, enabled during up-channel signaling (e.g. while performing equalization), or enabled during digital scan-based testing. The receiver is disabled when VBIAS is a logic '0'. VBIAS is an inverted version of the PDWN signal as illustrated in FIG. 1. When the PDWN signal is active (i.e. logic '1'), VBIAS is pulled to ground and n-fet transistor TBIAS is turned off, which cuts off the tail bias current IBIAS, thus effectively disabling receiver 400. When PDWN is deactive (i.e. logic '0'), VBIAS is pulled to Vdd and n-fet TBIAS is turned on, thus enabling receiver 400.

When up-channel receiver 400 is enabled during up-channel signaling, both first built-in offset voltage comparator 408 and second built-in offset voltage comparator 410 are enabled. First built-in offset voltage comparator 408 is enabled when LSSD_EN signal is deactive (logic '0'). Second built-in offset voltage comparator 410 is always enabled because the gate of p-fet transistor TER is tied to ground. In this mode, up-channel receiver 400 outputs a logic '1' at Z when VINP−VINN>Vth+, outputs a logic '0' when VINP−VINN<Vth−, and remains in its previous state when Vth−<VINP−VINN<Vth+. First built-in offset voltage comparator 408 and second built-in offset voltage comparator 410 both have memory, which is desired for improving noise immunity, but not permitted during digital scan-based testing.

When up-channel receiver 400 is enabled during digital scan-based testing, first built-in offset voltage comparator 408 is disabled and second built-in offset voltage comparator 410 is enabled. First built-in offset voltage comparator 408 is disabled when LSSD_EN signal is active (logic '1'). By disabling first built-in offset voltage comparator 408, hysteresis is turned off, thus satisfying the digital scan-based methodology requirement of not having memory. When first built-in offset voltage comparator 408 is disabled, second built-in offset voltage comparator 410 functions as a built-in offset-voltage comparator. Therefore, up-channel receiver 400 outputs a logic '1'; if and only if VINP−VINN>Vth+. Due to process, temperature, and supply variation, Vth+ will vary with some range (e.g. Vth+_lower to Vth+_upper). For illustrative purposes, Vth+_lower=70 mV and Vth+_upper=150 mV. This variation in Vth+ is addressed by skewing the output termination impedance as previously described and as illustrated in FIG. 3. For illustrative purposes, the output termination impedance at node ZP of FIG. 1 is set to 500 Ohms and the output termination impedance at node ZN of FIG. 1 is set to 50 Ohms. Thus: a) when a logic '1' is scanned in, if any bit of the differential driver IDAC is on, VINP−VINN will always be greater than Vth+_upper and thus will always guarantee a logic "1" at up-channel receiver output Z; b) when a logic "0" is scanned in, if any bit of the differential driver IDAC is on, VINP−VINN will always be less than Vth+_lower and thus will always guarantee a logic "0" at up-channel receiver output Z; and c) when all bits of the differential driver IDAC are off, regardless of scanning a logic '1' or logic "0", VINP−VINN is equal to zero (and always less than Vth+_lower) and thus will always guarantee a logic '0' at up-channel output Z. Therefore, the LSB of a differential driver is capable of being digitally tested in a repeatable, predictable, and reliable manner. Alternatively, if up-channel signaling is not required, hysteresis is not needed and only second built-in offset voltage comparator 410 is required.

Figure 5:
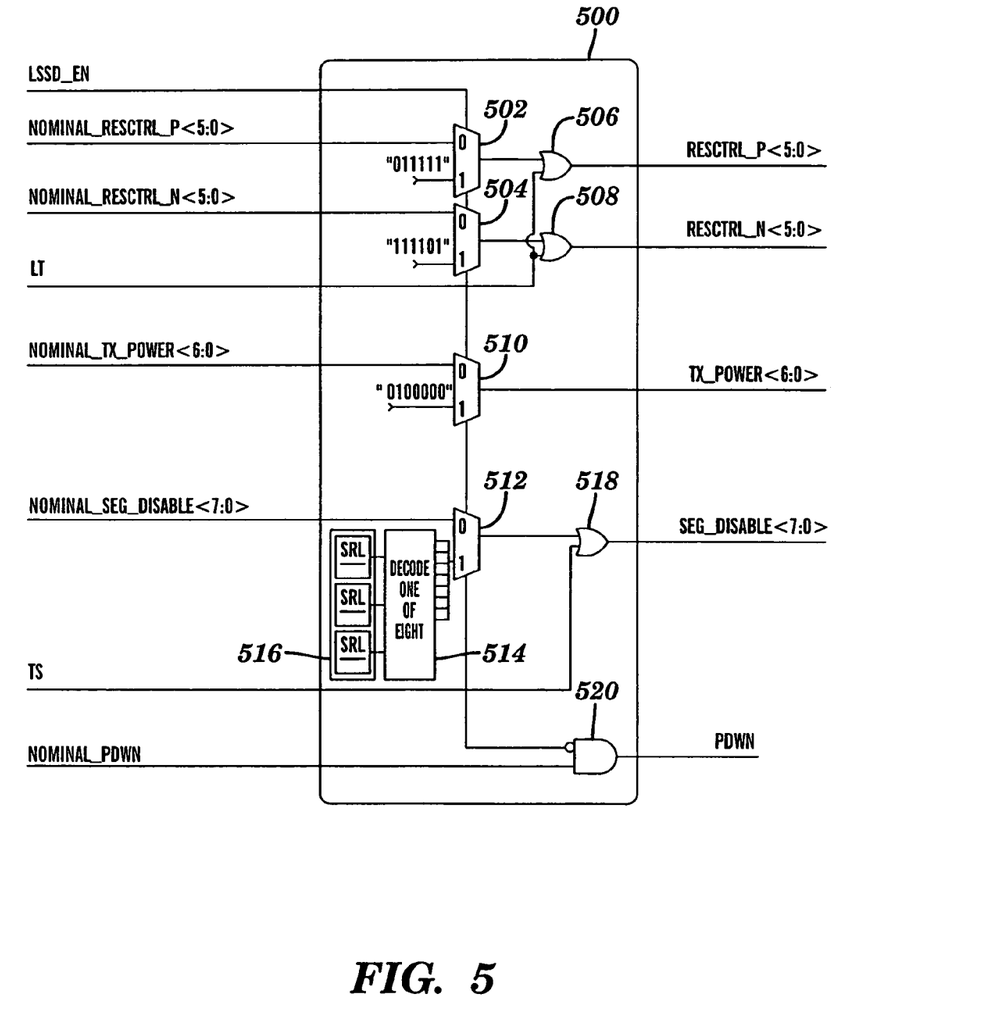
FIG. 5 is a diagram illustrating a LSSD test mode control circuit according to the present invention.

FIG. 5 illustrates in further detail LSSD test mode control circuit 500, which corresponds to LSSD test mode control circuit 140 of FIG. 1. Multiplexer circuits ("MUX") 502, 504, 510 and 512 are controlled by the LSSD_EN signal. When the scan-compatible analog differential driver circuit of the present invention is placed in digital test mode, LSSD_EN is active, thus enabling MUXs 502, 504, 510 and 512 to select test signals for the purpose of digitally testing the driver circuit. During normal operation, LSSD_EN is deactive, thus enabling MUXs 502, 504, 510 and 512 to select signals that correspond to normal functional operation of the driver circuit, which have been previously described.

MUX 502 selects either NOMINAL_RESCTRL_P<5:0> or hard-wired value '011111' in response to LSSD_EN. MUX 504 selects either NOMINAL_RESCTRL_N<5:0> or hard-wired value '111101' in response to LSSD_EN. During normal operation, LSSD_EN is deactivate (logic '0') and MUX 502 selects NOMINAL_RESCTRL_P<5:0> and MUX 504 selects NOMINAL_RESCTRL_N<5:0>. As previously described, NOMINAL_RESCTRL_P<5:0> and NOMINAL_RESCTRL_N<5:0> program the output termination impedance so that the impedance matches at nodes ZP and ZN of FIG. 1. This occurs when NOMINAL_RESCTRL_P<5:0>=NOMINAL_RESCTRL_N<5:0>. During digital scan-based testing, LSSD_EN is activate (logic '1'). When LSSD_EN is active, MUX 502 selects a hardwired value for RESCTRL_P<5:0> and MUX 504 selects a hard-wired value for RESCTRL_N<5:0>. In the preferred embodiment, when LSSD_EN is activate, RESCTRL_P<5:0> is set to '011111' and RESCTRL_N<5:0> is set to '111101'. These values allow the output termination impedance of programmable termination network 120 of FIG. 1 to be skewed in accordance with the present invention and as previously described. The values corresponding to RESCTRL_N/P<5:0> may be supplied from any storage element which is accessible during digital testing (i.e. embedded DRAM, fuses, ROM, etc.) so long as those values do not switch during digital testing. Switching of these signals can produce unpredictable test results. OR circuits 506 and 508 are optional and allow leakage testing to be performed by setting RESCTRL_P<5:0> and RESCTRL_N<5:0> to LT which equals '111111'. Leakage testing is well known in the art, and thus, is not discussed in further detail.

MUX 510 selects the drive strength signal to be supplied to power DAC 280 of FIG. 2. During digital scan-based testing, the power to IDAC circuit 270 of FIG. 2 is limited so as to not overpower the 3K Ohm resistor components Rn6 and Rp6 of FIG. 3. When LSSD_EN is active, MUX 510 selects the hardwired value '0100000' to be TX_POWER<6:0>. This value programs the IDAC circuit of the differential driver as illustrated in FIG. 2 to a quarter of the normal operating power. During normal operation, MUX 510 selects NOMINAL_TX_POWER<6:0> to be TX_POWER<6:0>.

MUX 512 selects either NOMINAL_SEG_DISABLE<7:0> or a decoded signal supplied from decoder 514 in response to LSSD_EN. During digital testing, only one segment of the differential driver may be tested during a test sequence (e.g. load test patterns, run system clock, unload test results). Test patterns that represent which segment is to be tested during a test sequence are provided to decoder 514 from SRLs 516 during digital testing. Decoder 514 may be any standard 3 to 8 decoder and decodes the signals provided by SRLs 516. For a differential driver that contains eight segments, three SRLs (i.e. 2^3 2^2 2^1) supply test patterns to decoder 514. These three inputs to decoder 514 enable the decoder to provide eight outputs to the differential driver when being tested, each output representing which one of eight segments within the differential driver will be activated during a particular test time. Test patterns are loaded into the SRLs, or "scanned in", each time a different segment is to be tested. For example, when $2^3\ 2^2\ 2^1=0\ 0\ 0$, SEG_DISABLE<7:0>=<11111110>; when $2^3\ 2^2\ 2^1=0\ 0\ 1$, SEG_DISABLE<7:0>=<11111101>; when $2^3\ 2^2\ 2^1=0\ 1\ 0$, SEG_DISABLE<7:0>=<11111011>; etc.; and finally when $2^3\ 2^2\ 2^1=1\ 1\ 1$, SEG_DISABLE<7:0>=<01111111>. The decoded signal is selected by MUX 512 and transmitted to the differential driver when LSSD_EN is active. During normal operation, MUX 512 selects NOMINAL_SEG_DISABLE<7:0>. The number of SRLs required to provide test input to the decoder and the size of the decoder depend upon the number of segments contained within the differential driver. Thus, any size decoder and number of SRLs for inputting test signals to the decoder are within the scope of this invention. OR circuit 518 is optional and allows the differential driver to be placed in tristate mode when TS is active. Placing a driver in tristate mode is well known in the art, and thus, is not discussed in further detail.

Logic circuit 520 either inhibits or gates NOMINAL_PDWN signal depending upon the value of LSSD_EN. When in digital scan-based test mode, LSSD_EN is active and inverted to a logic '0' at the input to logic circuit 520, thus inhibiting NOMINAL_PDWN and resulting in PDWN being a logic '0'. This assures that up-channel receiver 130 of FIG 1 remains powered on during digital testing as previously described and as illustrated in FIG. 4. During normal operation, the receiver may be powered down by activating the NOMINAL_PDWN signal (i.e. a logic '1'). LSSD_EN does not inhibit NOMINAL_PDWN when LSSD_EN is deactivate. Instead, logic circuit 520 gates NOMINAL_PDWN when LSSD_EN is deactive.

Figure 6:
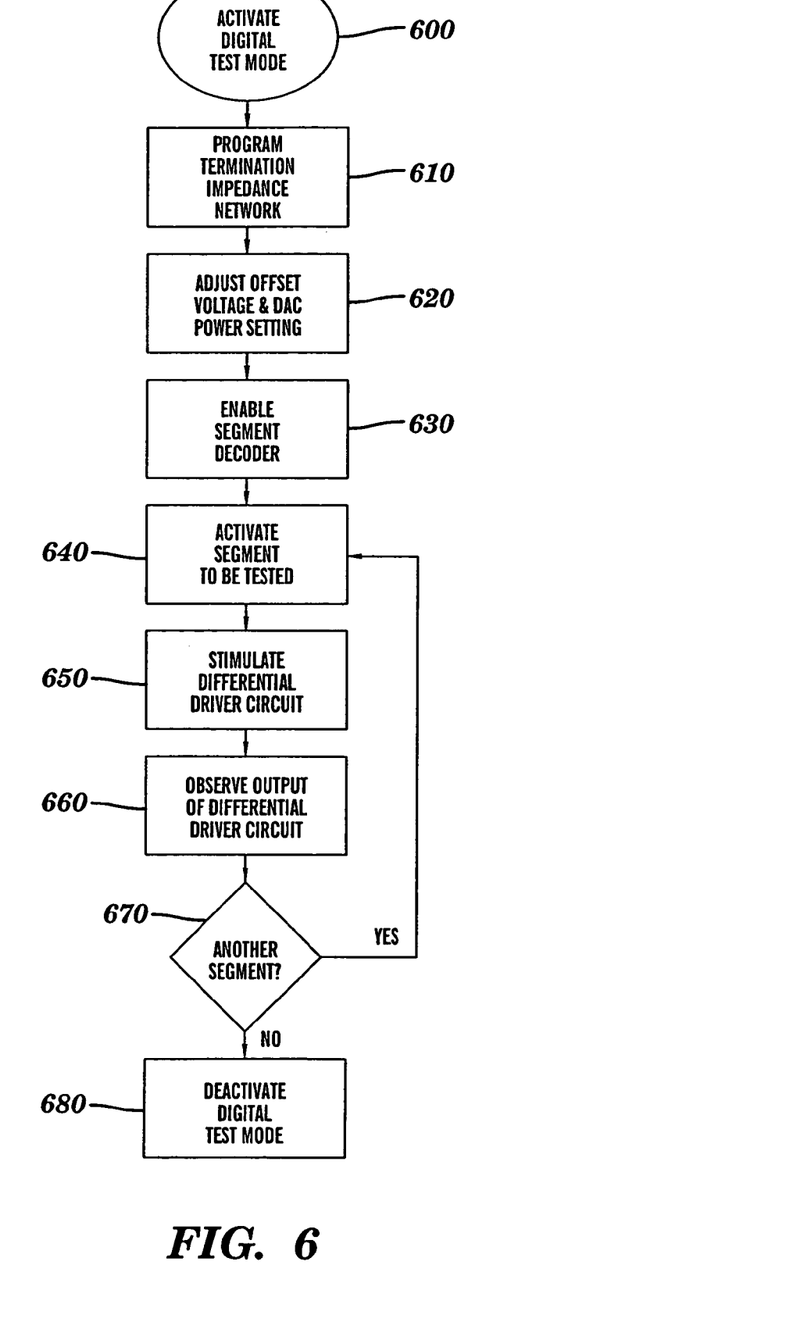
FIG. 6 is a diagram illustrating a method of digitally testing a scan-compatible analog differential driver circuit according to the present invention.

FIG 6 illustrates a method of digitally testing differential driver 110 of FIG. 1 in accordance with the present invention. Digital scan-based test mode is activated at 600 by activating the LSSD_EN signal illustrated in FIG. 1. In the preferred embodiment, this signal is a primary I/O signal that electrically configures the scan-compatible analog differential driver circuit 100 of FIG. 1 for digital testing. The LSSD_EN signal adjusts the electrical properties of programmable termination impedance network 120 of FIG. 1 at 610 by programming RESCTRL_P<5:0> to '0111111' and RESCTRL_N<5:0> to '111101', thus skewing the output impedance of the programmable termination impedance network in accordance with the present invention and as previously described. The LSSD_EN signal also adjusts the offset voltage of up-channel receiver 130 of FIG. 1 and selects a suitable power range for IDAC circuit 270 of FIG. 2 at 620 in accordance with the present invention and as previously described. For illustrative purposes, the power to the IDAC circuit is set to a quarter of the normal operating power by setting TX_POWER<6:0> to '0100000' as previously described and as illustrated in FIG. 5 so as to not overpower the 3K Ohm resistor components Rn6 and Rp6 of FIG. 3. The power range selectable by the LSSD_EN signal is dependent upon the configuration of the programmable termination impedance network and any range selected is within the scope of the invention. Additionally, LSSD_EN also enables decoder 514 of FIG. 5 at 630. In accordance with the present invention and as previously described, the decoder activates only one segment of the differential driver during any one test sequence, thus preventing segment contention at the output of the differential driver under test.

During digital scan-based testing, the decoder determines which segment is to be activated and activates that segment at 640 in accordance with the present invention and as previously described. The differential driver circuit is stimulated from SRLs (e.g. LSSD or GSM) at 650. During digital scan-based test modeling, the differential driver is modeled, for example as a number of n-bit OR gates, and digital test patterns are automatically generated (ATPG) for testing the components of the driver for stuck-at '1' or '0' faults. These test patterns provide stimulus to the driver circuit at 650 during digital scan testing. The stimulus represented by the TX_COEFFx<x:0> signals, which are generated during ATPG, are stored in SRLs and stimulate the differential driver circuit during digital scanbased testing. The four bits of differential data input signal AP<3:0> as illustrated in FIG. 2 are supplied from SRLs. The four bits of differential data input signal AN<3:0> as illustrated in FIG. 2 are also supplied from SRLs. The input stimulation signals to the differential driver (TX_COEFFx<x:0>, AP<3:0>, AN<3:0>, TX_POLARITY<3:0>, TAPDIS0/2/3, and SEG_DISABLE<7:0>) will all be observed at the output Z of up-channel receiver 130 of FIG. 1, which is connected to a SRL. Thus, the IDACs comprising the differential driver are digitally testable and observable during digital scan testing at 660. Each segment is activated in accordance with the present invention and as previously described and tested until all segments have been tested or until a fail occurs at 670. The LSB of the differential driver is stimulated and observed by stepping through each segment and testing each IDAC input bit. When testing is complete, digital test mode is deactivated at 680 by deactivating the LSSD_EN signal. When LSSD_EN is deactivate, the nominal values for RESCTRL_P/N, TX_POWER, and SEG_DISABLE as illustrated in FIG. 5 are supplied to scan-compatible analog differential driver circuit 100 of FIG. 1 in accordance with the present invention and as previously described. Digital scan testing methodologies are well known in the art, in particular, the incorporation of a digital scan architecture into a design, the generation of patterns for testing the design, and the stimulation and observation of circuits within the design.

In an alternate embodiment, up-channel receiver 130 of FIG. 1 is capable of being powered down when not in use. When digital scan-based test mode is activated at 600, NOMINAL_PDWN signal as previously described and as illustrated in FIG. 5 is inhibited by LSSD_EN. When LSSD_EN is active, PDWN is a logic '0', thus ensuring that the receiver remains powered on during testing. After testing is complete and digital test mode is deactivated at 680, NOMINAL_PDWN is no longer inhibited by LSSD_EN and may be activated to power down the differential receiver.

The description of the present invention has been presented for purposes of illustration and description but is not intended to be exhaustive or limited to the invention in the form disclosed. Many modifications and variations will be apparent to those of ordinary skill in the art. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A circuit, comprising: a control circuit configured to generate at least a first and second signal in response to a test enable signal; a differential driver circuit coupled to said control circuit, having a differential input node and a differential output node and configured to receive a differential input signal at said differential input node, amplify said differential input signal and transmit a differential output signal onto said differential output node in response said first signal, said differential driver circuit further comprising: a plurality of finite-impulse-response (FIR) latches coupled to said differential input node and configured to store said differential input signal; a plurality of preamplifier circuits coupled to said FIR latches and configured to amplify said differential input signal, wherein said preamplifier circuits are enabled in response to said first signal; a driver output stage coupled to said preamplifier circuits and configured to transmit said differential output signal; and a current digital-to-analog (DAC) circuit coupled to said driver output stage and configured to set drive strength of said driver output stage in response to a plurality of current digital-to-analog converter (IDAC) control signals; a programmable termination impedance circuit coupled to said control circuit and said differential output node, configured to generate a differential termination impedance at said differential output node in response to said second signal; and a differential receiver circuit coupled to said control circuit and said differential output node, configured to receive said differential output signal, convert said differential output signal to a single ended signal and transmit said single ended signal in response to said test enable signal.

2. The circuit of claim 1 further comprising: a first shift-register-latch circuit coupled to said differential input node and configured to store said differential input signal; and a second shift-register-latch circuit coupled to said differential receiver circuit and configured to store said transmitted single ended signal.

3. The circuit of claim 1, wherein only one of said preamplifier circuits is enabled during a test sequence.

4. The circuit of claim 1, further comprising a third shift-register-latch circuit coupled to said current DAC circuit and configured to store said IDAC control signals.

5. A circuit, comprising: a control circuit configured to generate at least a first and second signal in response to a test enable signal; a differential driver circuit coupled to said control circuit, having a differential input node and a differential output node and configured to receive a differential input signal at said differential input node, amplify said differential input signal and transmit a differential output signal onto said differential output node in response said first signal; a programmable termination impedance circuit coupled to said control circuit and said differential output node, configured to generate a differential termination impedance at said differential output node in response to said second signal, said programmable termination impedance circuit comprises a plurality of resistor components, each resistor component having an associated switch for selectively connecting that resistor component from a voltage source to said differential output node, wherein at least one, but less than all of said resistor components are coupled to a first node of said differential output node and a remainder of said resistor components are coupled to a second node of said differential output node; and a differential receiver circuit coupled to said control circuit and said differential output node, configured to receive said differential output signal, convert said differential output signal to a single ended signal and transmit said single ended signal in response to said test enable signal.

6. The circuit of claim 5, wherein said differential termination impedance is skewed at said first node and said second node when said test enable signal is active and said differential termination impedance is matched at said first node and said second node when said test enable signal is deactive.

7. The circuit of claim 5, wherein a first six of said resistor components are coupled to said first node and a second six of said resistor components are coupled to said second node.

8. The circuit of claim 7, wherein a first resistor of said first six resistor components is approximately 53 Ohms, a second resistor of said first six resistor components is approximately 71 Ohms, a third resistor of said first six resistor components is approximately 144 Ohms, a fourth resistor of said first six resistor components is approximately 287 Ohms, a fifth resistor of said first six resistor components is approximately 554 Ohms, a sixth resistor of said first six resistor components is approximately 3001 Ohms, a first resistor of said second six resistor components is approximately 53 Ohms, a second resistor of said second six resistor components is approximately 71 Ohms, a third resistor of said second six resistor components is approximately 144 Ohms, a fourth resistor of said second six resistor components is approximately 287 Ohms, a fifth resistor of said second six resistor components is approximately 554 Ohms, and a sixth resistor of said second six resistor components is approximately 3001 Ohms.

9. A circuit, comprising: a control circuit configured to generate at least a first and second signal in response to a test enable signal; a differential driver circuit coupled to said control circuit, having a differential input node and a differential output node and configured to receive a differential input signal at said differential input node, amplify said differential input signal and transmit a differential output signal onto said differential output node in response said first signal; a programmable termination impedance circuit coupled to said control circuit and said differential output node, configured to generate a differential termination impedance at said differential output node in response to said second signal; and a differential receiver circuit coupled to said control circuit and said differential output node, configured to receive said differential output signal, convert said differential output signal to a single ended signal and transmit said single ended signal in response to said test enable signal, said differential receiver circuit comprising: a differential amplifier circuit coupled to said differential output node and configured to receive said differential output signal; a built-in offset voltage comparator circuit coupled to said differential amplifier circuit and configured to output a signal in response to said differential output signal and an offset voltage; an output stage coupled to said differential amplifier circuit and said built-in offset voltage comparator circuit and configured to transmit said single ended signal in response to said output signal of said built-in offset voltage comparator circuit; and a level shifter circuit coupled to said output stage and configured to transition power supply domains from an analog power supply domain to a digital power supply domain.

10. The circuit of claim 9, wherein said differential receiver further comprises a second built-in offset voltage comparator circuit electrically coupled in parallel with said first built-in offset voltage comparator circuit and configured to output a signal in response to said differential output signal and a second offset voltage, wherein said first built-in offset voltage comparator circuit and said second built-in offset voltage comparator circuit form a hysteresis comparator.

11. The circuit of claim 10 wherein said hysteresis comparator is disabled when said second built-in offset voltage comparator circuit is disabled.

12. The circuit of claim 9, wherein said differential receiver circuit is disabled when said differential amplifier circuit is disabled.

13. The circuit of claim 9, wherein said output signal of said built-in offset voltage comparator is high when said received differential output signal is greater than said offset voltage and low otherwise.

* * * * *